(12) United States Patent
Yamada et al.

(10) Patent No.: US 7,671,777 B2
(45) Date of Patent: Mar. 2, 2010

(54) AD CONVERTER

(75) Inventors: Takayoshi Yamada, Osaka (JP);
Takumi Yamaguchi, Kyoto (JP);
Shigetaka Kasuga, Osaka (JP);
Takahiko Murata, Osaka (JP)

(73) Assignee: Panasonic Corporation, Osaka (JP)

( * ) Notice: Subject to any disclaimer, the term of this patent is extended or adjusted under 35 U.S.C. 154(b) by 328 days.

(21) Appl. No.: 11/822,589

(22) Filed: Jul. 9, 2007

(65) Prior Publication Data
US 2008/0018517 A1 Jan. 24, 2008

(30) Foreign Application Priority Data

Jul. 11, 2006 (JP) ............................. 2006-190013
Jun. 1, 2007 (JP) ............................. 2007-146827

(51) Int. Cl.
*H03M 1/34* (2006.01)
(52) U.S. Cl. ...................... 341/165; 341/143; 341/155; 341/166; 341/167; 341/168
(58) Field of Classification Search ......... 341/118–122, 341/143, 155–172
See application file for complete search history.

(56) References Cited

U.S. PATENT DOCUMENTS

| | | | | |
|---|---|---|---|---|
| 5,455,583 A * | 10/1995 | Stryjewski | ................ | 341/156 |
| 5,691,722 A * | 11/1997 | Wang | ................ | 341/161 |
| 6,239,734 B1 * | 5/2001 | Bae et al. | ................ | 341/164 |
| 6,424,284 B1 * | 7/2002 | Lopata et al. | ................ | 341/163 |
| 6,664,911 B2 * | 12/2003 | Hirai | ................ | 341/159 |
| 7,038,609 B1 * | 5/2006 | Hurrell | ................ | 341/156 |
| 7,205,921 B1 * | 4/2007 | Savla | ................ | 341/155 |
| 2002/0154049 A1 * | 10/2002 | Hsueh | ................ | 341/161 |
| 2006/0066464 A1 * | 3/2006 | San et al. | ................ | 341/155 |
| 2008/0198056 A1 * | 8/2008 | Hurrell | ................ | 341/155 |
| 2009/0109079 A1 * | 4/2009 | Ahmad | ................ | 341/156 |
| 2009/0128382 A1 * | 5/2009 | Matsukawa et al. | ......... | 341/120 |
| 2009/0184857 A1 * | 7/2009 | Furuta et al. | ................ | 341/156 |

FOREIGN PATENT DOCUMENTS

| JP | 3507800 | 2/2001 |
|---|---|---|
| JP | 2002-232291 | 8/2002 |

* cited by examiner

*Primary Examiner*—Linh V Nguyen
(74) *Attorney, Agent, or Firm*—McDermott Will & Emery LLP

(57) ABSTRACT

An AD converter includes an analog data storing unit, a first DA converter for converting an input digital data into a first analog reference voltage which varies within a first voltage range in a range of every possible signal voltage of the input analog data, a second DA converter for converting the input digital data into a second analog reference voltage which varies within a second voltage range in the range of every possible signal voltage of the input analog data, a first comparator for comparing the input analog data with the first reference voltage, a second comparator for comparing the input analog data with the second reference voltage and a digital data storing unit for storing a digital data corresponding to a point of time when a change of state occurs in the comparison results of each of the first and second comparators.

16 Claims, 18 Drawing Sheets

AD CONVERTER

BACKGROUND OF THE INVENTION

1. Field of the Invention

The present invention relates to an AD converter for converting an analog signal to a digital signal. In particular, it relates to an AD converter capable of analog-to-digital signal conversion in a short time.

2. Description of Related Art

Music, images and moving pictures, which have been recorded as analog data, are now being recorded as digital data with high quality and enhanced convenience. An AD converter has been used to convert analog data into digital data. For capturing images and moving pictures, image sensors such as a CCD (charge coupled device) and a CMOS sensor have been used and the need for signal processing devices for converting an analog image output signal into a digital signal is increasing. Also in many sensors used for controlling various devices, an analog output signal is converted into a digital signal to facilitate the processing in the control unit. Thus, the range of uses of the AD converter for converting an analog value to a digital value has been increasing.

Although there are various AD converters of different structures, an AD converter of relatively simple structure has been proposed by Japanese Patent No. 3507800, for example. This AD converter generates an analog reference voltage and performs a comparison between the reference voltage and an input signal voltage while gradually changing the reference voltage. Then, the level of the signal voltage is judged from the value of the reference voltage at a point of time when the magnitude relation between the reference voltage and the signal voltage has changed such that the signal voltage is converted into a digital value.

In this AD converter, as shown in FIG. 18, an analog signal of a selected signal line (φs) which is read and stored in a first period T1 is converted into a digital signal in a second period T2. More specifically, an analog signal (Vs) stored in a sample hold circuit is input to one of input terminals of a comparator and a reference voltage (Vc) which increases with time is input into another input terminal of the comparator, while output data (DATA) of a digital counter to which clocks (CLK) are input increases one by one. The output of the comparator (Vcomp) for comparing the analog signal (Vs) with the reference voltage (Vc) causes a change of state at around a point of time when the analog signal (Vs) and the reference voltage (Vc) agree with each other. The output data (DATA) of the digital counter at the point of time when the change of state occurs is latched. The latched output data (DATA) is a digital signal corresponding to the analog signal (Vs).

With the above-described AD converter, however, the comparison between the signal voltage and the reference voltage is performed successively while changing the reference voltage from the minimum value to the maximum value in the range of every possible signal voltage. Therefore, long time has been taken to convert the analog signal to the digital signal. In order to increase the resolution of a digital value by 1 bit, the number of comparisons must be doubled. Therefore, the long conversion time is almost doubled. Thus, the conventional AD converter involves a problem in the conversion of a digital value with a high bit count.

Further, in an AD converter for converting an analog signal of an image sensor or the like into a digital signal, it is desirable to take a difference between an output value of a dark pixel and an output value of a light-exposed pixel as a signal output such that noise components are removed. For that purpose, there are a method of taking the difference between the analog signals before digital conversion and a method of taking the difference after the digital conversion of the analog signals from the dark and light-exposed pixels. In the latter method, however, the digital conversion must be performed twice on the signals from the dark and light-exposed pixels. Therefore, the analog-to-digital signal conversion takes long time.

SUMMARY OF THE INVENTION

In light of the above, an object of the present invention is to provide an AD converter capable of converting an analog signal into a digital signal in a short time.

To achieve the object, an AD converter according to a first aspect of the present invention includes: an analog data storing unit for storing an input analog data; a first DA converter for converting an input digital data into a first analog reference voltage which varies within a first voltage range in a range of every possible signal voltage of the input analog data; a second DA converter for converting the input digital data into a second analog reference voltage which varies within a second voltage range in the range of every possible signal voltage of the input analog data; a first comparator for comparing the input analog data from the analog data storing unit with the first reference voltage; a second comparator for comparing the input analog data from the analog data storing unit with the second reference voltage; and a digital data storing unit for storing a digital data corresponding to a point of time when a change of state occurs in the comparison results of each of the first and second comparators.

With respect to the AD converter according to the first aspect of the present invention, the first voltage range and the second voltage range are summed to constitute the range of every possible signal voltage of the input analog data.

With respect to the AD converter according to the first aspect of the present invention, the first voltage range and the second voltage range are equal in size.

With respect to the AD converter according to the first aspect of the present invention, the first voltage range is a range covering from the minimum value to the intermediate value in the range of every possible signal voltage of the input analog data and the second voltage range is a range covering from the intermediate value to the maximum value in the range of every possible signal voltage of the input analog data.

With respect to the AD converter according to the first aspect of the present invention, the first reference voltage is a voltage which increases with time from the minimum value to the intermediate value in the range of every possible signal voltage of the input analog data and the second reference voltage is a voltage which decreases with time from the maximum value to the intermediate value in the range of every possible signal voltage of the input analog data.

With respect to the AD converter according to the first aspect of the present invention, the first reference voltage is a voltage which increases with time from the intermediate value to the maximum value in the range of every possible signal voltage of the input analog data and the second reference voltage is a voltage which decreases with time from the intermediate value to the minimum value in the range of every possible signal voltage of the input analog data.

With respect to the AD converter according to the first aspect of the present invention, the first reference voltage is a voltage which increases with time from the intermediate value to the maximum value in the range of every possible signal voltage of the input analog data and the second reference voltage is a voltage which increases with time from the minimum value to the intermediate value in the range of every possible signal voltage of the input analog data.

With respect to the AD converter according to the first aspect of the present invention, the first reference voltage is a voltage which decreases with time from the maximum value to the intermediate value in the range of every possible signal voltage of the input analog data and the second reference voltage is a voltage which decreases with time from the intermediate value to the minimum value in the range of every possible signal voltage of the input analog data.

With respect to the AD converter according to the first aspect of the present invention, the first voltage range and the second voltage range are different in size.

With respect to the AD converter according to the first aspect of the present invention, the rate of change of the first reference voltage with respect to the input digital data is different from the rate of change of the second reference voltage with respect to the input digital data.

With respect to the AD converter according to the first aspect of the present invention, the range of every possible value of the input digital data to be input to the first DA converter is different from the range of every possible value of the input digital data to be input to the second DA converter.

With respect to the AD converter according to the first aspect of the present invention, the time taken for the first reference voltage to vary within the first voltage range is equal to the time taken for the second reference voltage to vary within the second voltage range.

With respect to the AD converter according to the first aspect of the present invention, the first voltage range and the second voltage range have an overlapping range between them and the AD converter further comprises a correction circuit for correcting the value of the digital data stored in the digital data storing unit when the input analog data exists in the overlapping range.

With respect to the AD converter according to the first aspect of the present invention, at least one of the first and second DA converters does not have a linear output property.

An AD converter according to a second aspect of the present invention includes: an analog data storing unit for storing an input analog data; at least two or more DA converters, each of which converting an input digital data into an analog reference voltage which varies within an arbitrary voltage range in a range of every possible signal voltage of the input analog data; comparators of the same number as the DA converters, each of which comparing the input analog data from the analog data storing unit with the reference voltage; and a digital data storing unit for storing a digital data corresponding to a point of time when a change of state occurs in the comparison results of each of the comparators, wherein the arbitrary voltage ranges in which the reference voltages converted to analog by the at least two or more DA converters vary, respectively, are summed to constitute the range of every possible signal voltage of the input analog data.

An AD converter according to a third aspect of the present invention includes an analog data storing unit for storing an input analog data; a single DA converter or two or more DA converters, each of which converting an input digital data into an analog reference voltage which varies within an arbitrary voltage range in a range of every possible signal voltage of the input analog data; comparators of the same number as the DA converters, each of which comparing the input analog data from the analog data storing unit with the reference voltage; and a digital data storing unit for storing a digital data corresponding to a point of time when a change of state occurs in the comparison results of each of the comparators, wherein the arbitrary voltage range in which the reference voltage converted to analog by the single DA converter or the sum of the arbitrary voltage ranges in which the reference voltages converted to analog by the two or more DA converters constitutes the range of every possible signal voltage of the input analog data and the single DA converter or the two or more DA converters do not have a linear output property.

An AD converter according to a fourth aspect of the present invention includes a first analog data storing unit for storing an input analog data from a dark pixel; a second analog data storing unit for storing an input analog data from a light-exposed pixel; a DA converter for converting an input digital data into an analog reference voltage; a first comparator for comparing the input analog data from the dark pixel delivered from the first analog data storing unit with the reference voltage; a second comparator for comparing the input analog data from the light-exposed pixel delivered from the second analog data storing unit with the reference voltage; and a digital data storing unit for storing a digital data corresponding to a point of time when a change of state occurs in the comparison results each of the first and second comparators.

An AD converter according to a fifth aspect of the present invention includes a first analog data storing unit for storing an input analog data from a dark pixel; a second analog data storing unit for storing an input analog data from a light-exposed pixel; a first DA converter for converting an input digital data into a first analog reference voltage which varies within a range covering from the minimum value to the intermediate value in a range of every possible signal voltage of the input analog data from the light-exposed pixel; a second DA converter for converting the input digital data into a second analog reference voltage which varies within a range covering from the intermediate value to the maximum value in the range of every possible signal voltage of the input analog data from the light-exposed pixel; a first comparator for comparing the input analog data from the dark pixel delivered from the first analog data storing unit with the first reference voltage; a second comparator for comparing the input analog data from the light-exposed pixel delivered from the second analog data storing unit with the first reference voltage; a third comparator for comparing the input analog data from the light-exposed pixel delivered from the second analog data storing unit with the second reference voltage; and a digital data storing unit for storing a digital data corresponding to a point of time when a change of state occurs in the comparison results of each of the first, second and third comparators.

An AD converter according to a sixth aspect of the present invention includes a first analog data storing unit for storing an input analog data; a subtraction circuit for subtracting the intermediate value in a range of every possible signal voltage of the input analog data from the input analog data; a second analog data storing unit for storing the input analog data from the subtraction circuit after the subtraction; a DA converter for converting an input digital data into an analog reference voltage which varies in a range covering from the minimum value to the intermediate value in the range of every possible signal voltage of the input analog data; a first comparator for comparing the input analog data from the first analog data storing unit with the reference voltage; a second comparator for comparing the input analog data after the subtraction from the second analog data storing unit with the reference voltage; and a digital data storing unit for storing a digital data corresponding to a point of time when a change of state occurs in the comparison results of each of the first and second comparators.

Thus, in the AD converters according to the first to sixth aspects of the present invention, a comparison between the signal voltage and the reference voltage is performed while gradually changing the reference voltage. Therefore, in an AD converter for converting an analog signal to a digital signal, time required for analog-to-digital signal conversion is reduced.

BRIEF DESCRIPTION OF THE DRAWINGS

FIGS. 2A and 2B are graphs each illustrating a reference voltage used in the first embodiment of the present invention and FIG. 2C is a graph illustrating a conventional reference voltage.

DETAILED DESCRIPTION OF THE INVENTION

Hereinafter, embodiments of the present invention will be described with reference to the drawings.

First Embodiment

Figure 1:
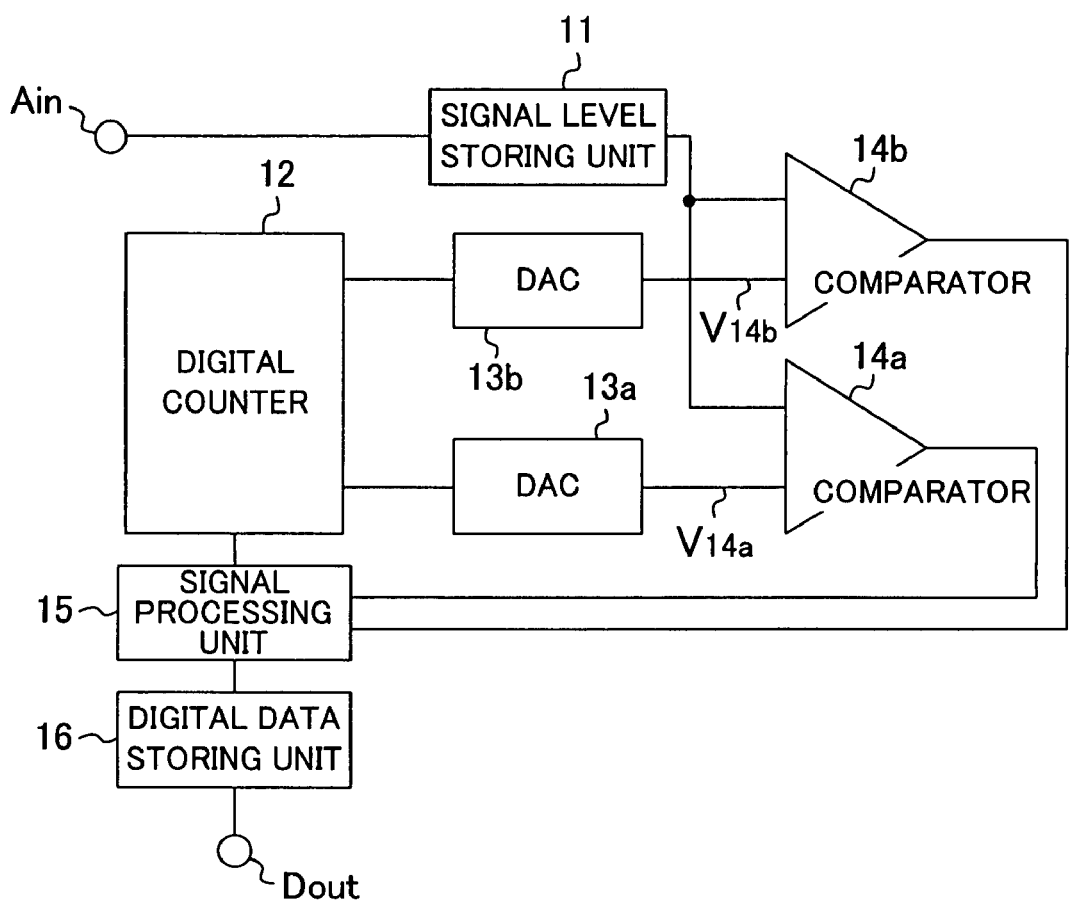
FIG. 1 is a diagram illustrating the structure of an AD converter according to a first embodiment of the present invention.

FIG. 1 shows the structure of an AD converter according to a first embodiment of the present invention.

The AD converter shown in FIG. 1 includes a signal level storing unit 11, a digital counter 12, first and second DA converters (DAC) 13a and 13b, first and second comparators 14a and 14b, a signal processing unit 15 and a digital data storing unit 16.

The signal level storing unit 11 stores and outputs a signal level of an input analog data from an analog data input terminal Ain. When the digital counter 12 to which clocks are input delivers a digital output, the digital output is converted by the first DA converter 13a into an analog data which varies within a first voltage range in a range of every possible voltage of the input analog data and then output as a first reference voltage V14a. At the same time, the digital output from the digital counter 12 is converted by the second DA converter 13b into an analog data which varies within a second voltage range in the range of every possible voltage of the input analog data and then output as a second reference voltage V14b.

The first comparator 14a sequentially compares a signal voltage of the input analog data stored in the signal level storing unit 11 with the first reference voltage V14a from the first DA converter 13a. Likewise, the second comparator 14b sequentially compares the signal voltage of the input analog data stored in the signal level storing unit 11 with the second reference voltage V14b from the second DA converter 13b. At this time, a change of state occurs in the output of the first comparator 14a at a point of time when the value of the first reference voltage V14a exceeds or falls short of the value of the signal voltage of the input analog data, while a change of the state occurs in the output of the second comparator 14b at a point of time when the value of the second reference voltage V14b exceeds or falls short of the signal voltage of the input analog data. The digital counter 12 stores a digital data corresponding to the time of the change of the state in the digital data storing unit 16 via the signal processing unit 15. The stored digital data is output from a digital data output terminal Dout.

In the present embodiment, the comparison between the signal voltage and the first reference voltage V14a which is output from the first DA converter 13a and varies within the first voltage range in the range of every possible voltage of the input analog data is performed simultaneously with the comparison between the signal voltage and the second reference voltage V14b which is output from the second DA converter 13b and varies within the second voltage range in the range of every possible voltage of the input analog data. Therefore, as described later in detail, time required for the conversion of the analog data to the digital data is reduced.

Hereinafter, the first voltage range of the first reference voltage V14a and the second voltage range of the second reference voltage V14b will be explained with specific examples.

Figure 2A:
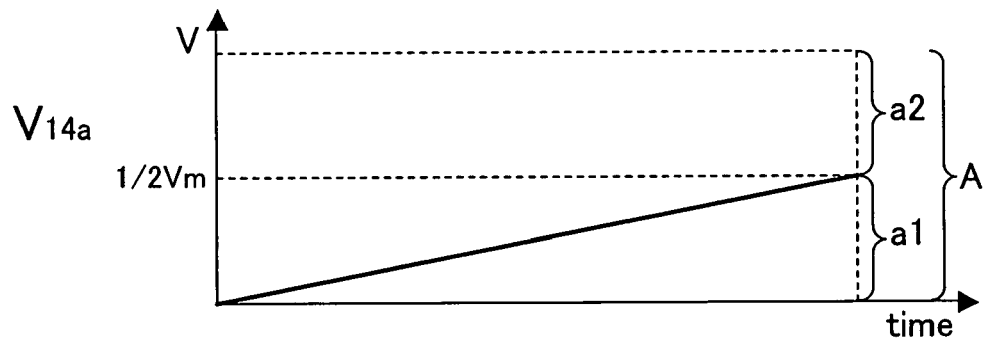
FIGS. 2A to 2C show reference voltages to be input to a comparator according to the first embodiment and a comparative conventional reference voltage.

First, as shown in FIG. 2A, the first DA converter 13a outputs, as the first reference voltage V14a, a signal which varies linearly in the first voltage range al, i.e., from the minimum value to the intermediate value (1/2 Vm) in the range A of every possible signal voltage of the input analog data. On the other hand, as shown in FIG. 2B, the second DA converter 13*b* outputs, as the second reference voltage V14*b*, a signal which varies linearly in the second voltage range a2, i.e., from the maximum value to the intermediate value in the range A of every possible signal voltage of the input analog data.

Figure 2B:
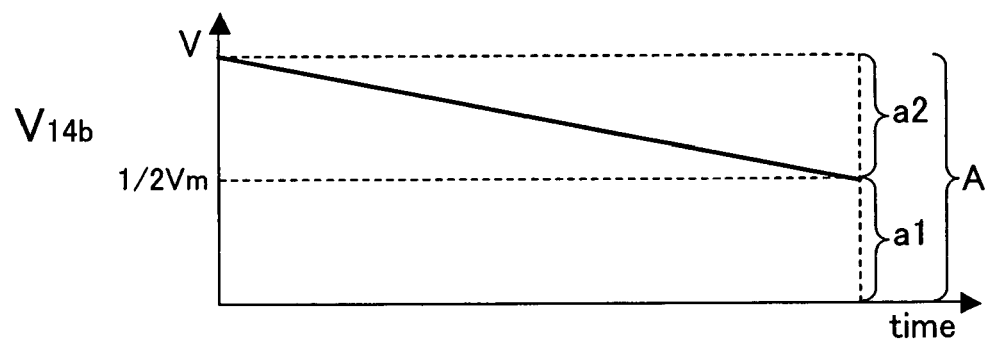
Figure 2C:
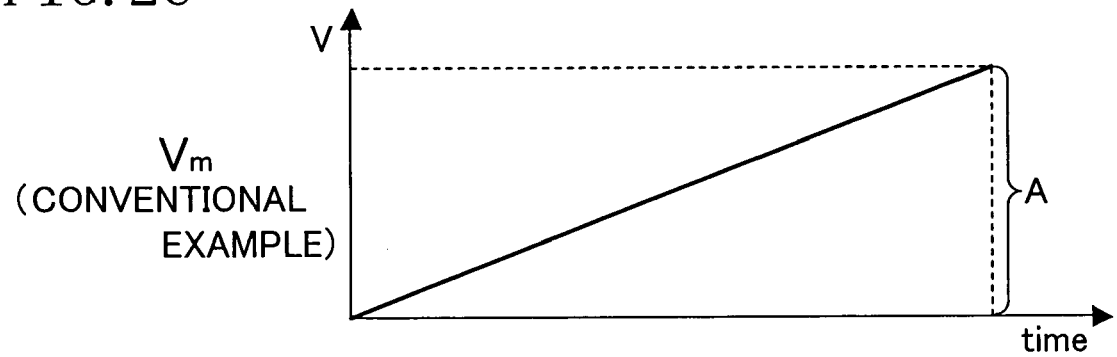

As shown in FIGS. 2A and 2B, the DA converters 13*a* and 13*b* are provided to output the reference voltages V14*a* and V14*b* which vary linearly in the two equal-sized ranges a1 and a2, respectively. The ranges a1 and a2 cover the range from the minimum value to the maximum value of the range A of every possible signal voltage of the input analog data without overlapping each other. Then, the comparator 14*a* to which the reference voltage V14*a* is input performs the comparison between the reference voltage V14*a* and the input analog data, while the comparator 14*b* to which the reference voltage V14*b* is input simultaneously performs the comparison between the reference voltage V14*b* and the input analog data. Thus, time required for converting the digital data into the analog data is significantly reduced. With a conventional AD converter, as shown in FIG. 2C, the signal voltage is compared with a single reference voltage Vm which varies in the range covering from the minimum value to the maximum value in the range A of every possible signal voltage of the input analog data. Therefore, in comparison with such a conventional AD converter, the AD converter of the present embodiment performs the digital conversion of the whole analog data in about a half period of time.

Figure 3A:
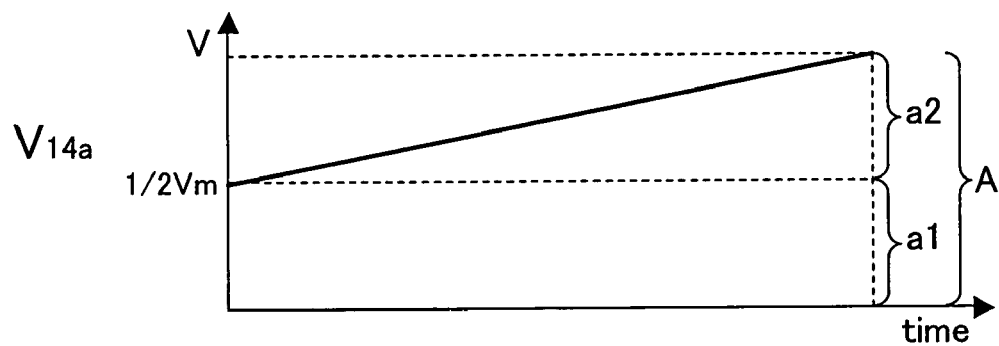
FIGS. 3A and 3B are graphs each illustrating a modification of the reference voltage to be input to the comparator according to the first embodiment of the present invention.
Figure 3B:
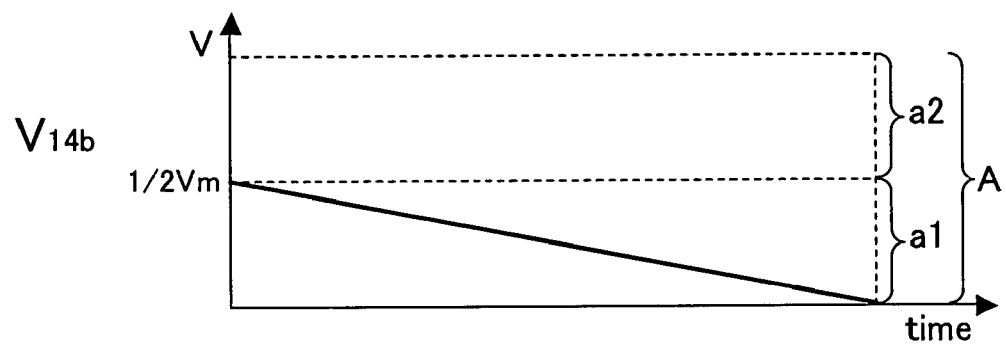

The same effect is obtained even if the signal voltage is compared with the first reference voltage V14*a* which varies linearly within the first voltage range a1, i.e., from the intermediate value to the maximum value in the range A of every possible signal voltage of the input analog data, and with the second reference voltage V14*b* which varies linearly within the second voltage range a2, i.e., from the intermediate value to the minimum value in the range A of every possible signal voltage of the input analog data shown in FIGS. 3A and 3B. The first and second voltage ranges a1 and a2 have the same size and cover the range from the minimum value to the maximum value in the range A of every possible signal voltage of the input analog data without overlapping each other.

Figure 4A:
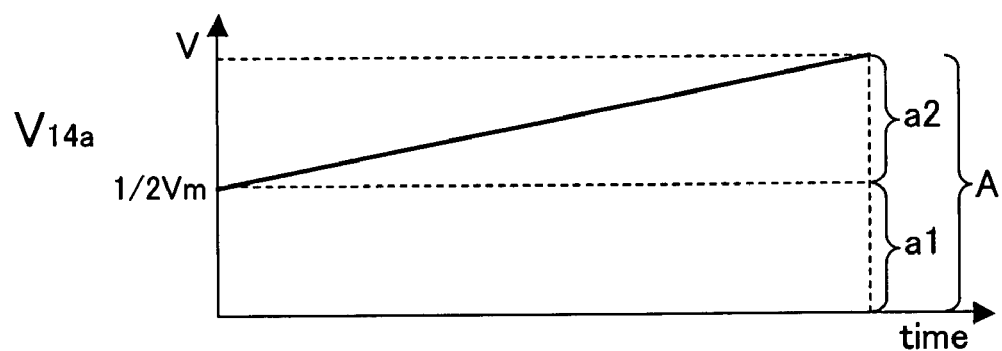
FIGS. 4A and 4B are graphs each illustrating a modification of the reference voltage to be input to the comparator according to the first embodiment of the present invention.
Figure 4B:
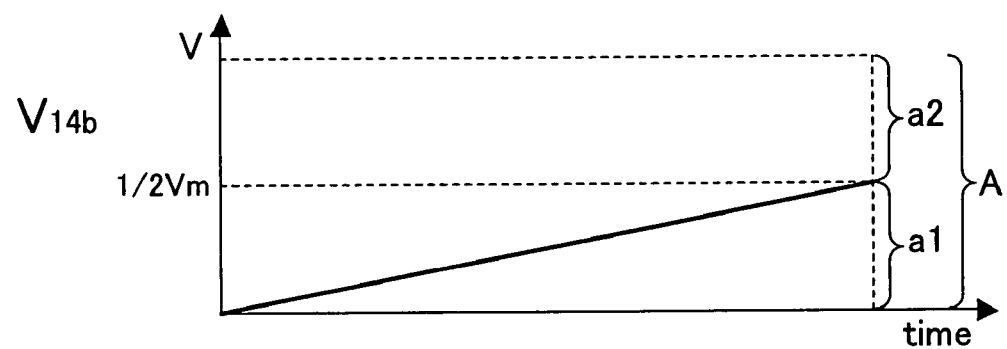

The same effect is also obtained even if the signal voltage is compared with the first reference voltage V14*a* which varies linearly within the first voltage range a1, i.e., from the intermediate value to the maximum value in the range A of every possible signal voltage of the input analog data, and with the second reference voltage V14*b* which varies linearly within the second voltage range a2, i.e., from the minimum value to the intermediate value in the range A of every possible signal voltage of the input analog data shown in FIGS. 4A and 4B. The first and second voltage ranges a1 and a2 have the same size and cover the range from the minimum value to the maximum value in the range A of every possible signal voltage without overlapping each other.

Figure 5A:
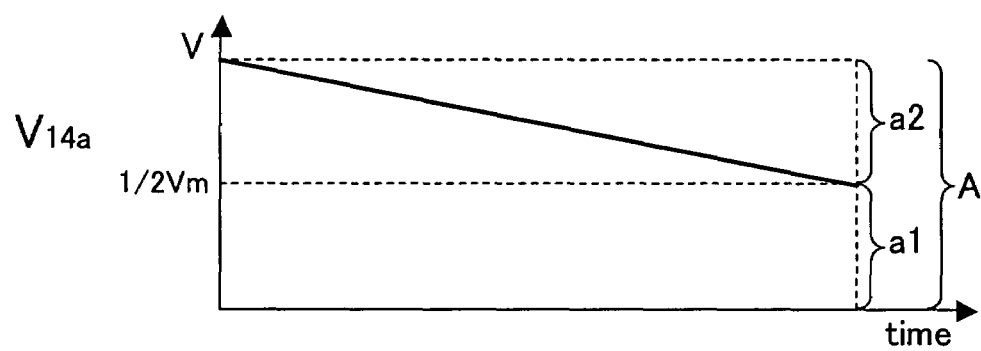
FIGS. 5A and 5B are graphs each illustrating a modification of the reference voltage to be input to the comparator according to the first embodiment of the present invention.
Figure 5B:
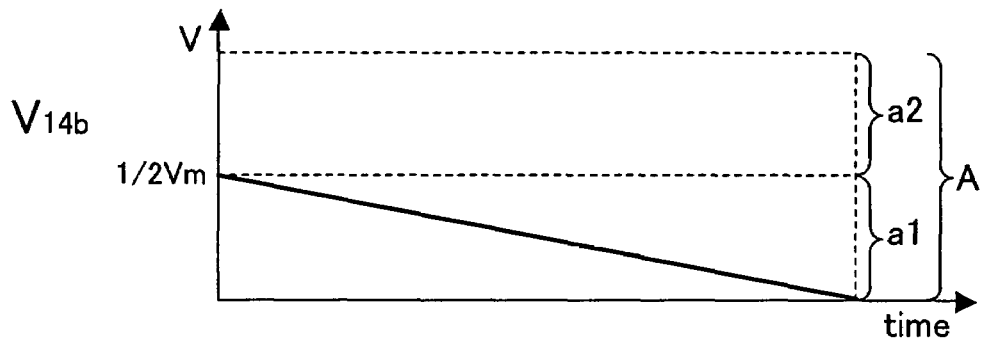

The same effect is also obtained even if the signal voltage is compared with the first reference voltage V14*a* which varies linearly within the first voltage range a1, i.e., from the maximum value to the intermediate value in the range A of every possible signal voltage of the input analog data, and with the second reference voltage V14*b* which varies linearly within the second voltage range a2, i.e., from the intermediate value to the minimum value in the range A of every possible signal voltage of the input analog data shown in FIGS. 5A and 5B. The first and second voltage ranges a1 and a2 have the same size and cover the range from the minimum value to the maximum value of the range A of every possible signal voltage without overlapping each other.

Figure 6A:
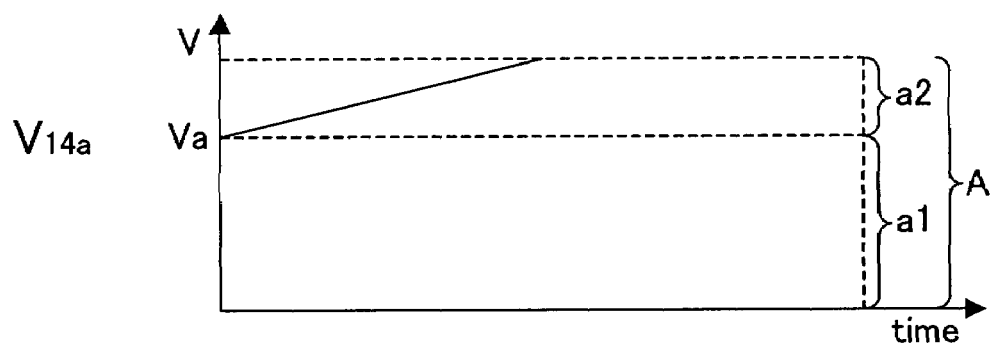
FIGS. 6A and 6B are graphs each illustrating a modification of the reference voltage to be input to the comparator according to the first embodiment of the present invention.
Figure 6B:
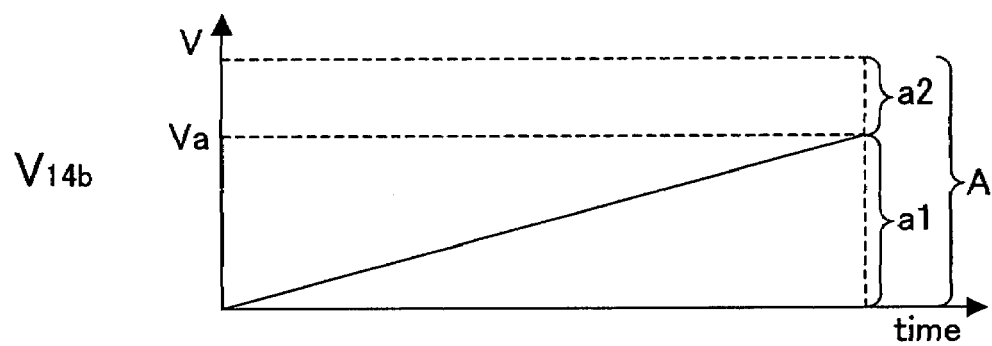

Further, as shown in FIGS. 6A and 6B, the signal voltage may be compared with the first reference voltage V14*a* which varies linearly within the first voltage range a1 (from Va to the maximum value) and with the second reference voltage V14*b* which varies linearly within the second voltage range a2 (from the minimum value to Va). The first and second voltage ranges a1 and a2 have different sizes and cover the range from the minimum value to the maximum value of the range A of every possible signal voltage of the input analog data without overlapping each other.

Thus, with the sizes (widths) of the first and second voltage ranges a1 and a2 varied from each other, resolution is enhanced in a required region. Therefore, digital conversion of a low luminance region is performed at low resolution and that of a high luminance region is performed at high resolution. Or alternatively, the digital conversion of the low luminance region may be performed at high resolution and that of the high luminance region may be performed at low resolution.

Figure 7A:
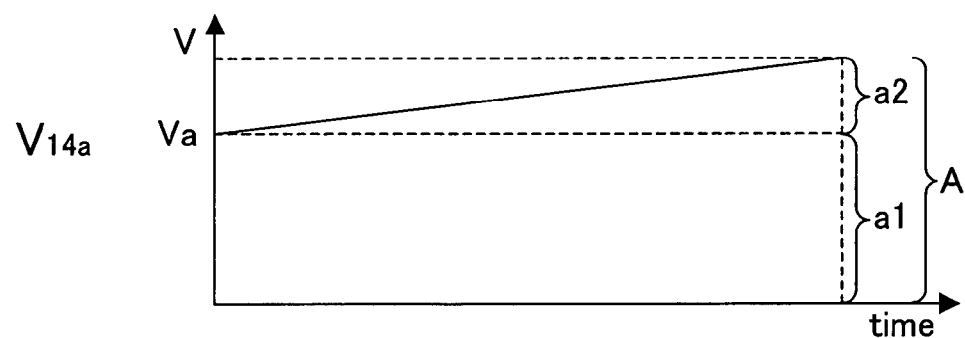
FIGS. 7A and 7B are graphs each illustrating a modification of the reference voltage to be input to the comparator according to the first embodiment of the present invention.
Figure 7B:
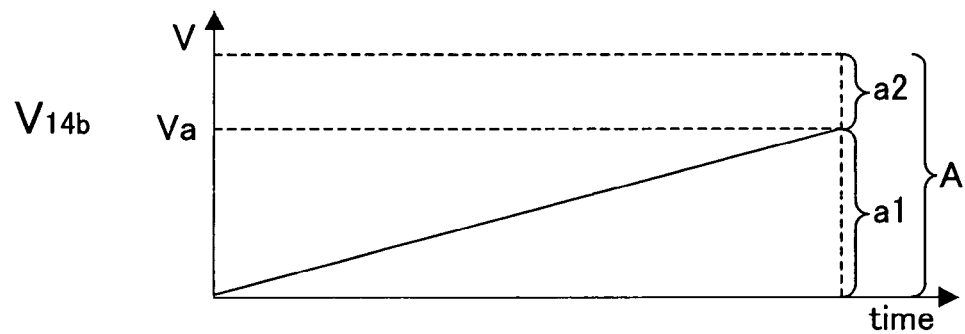

As shown in FIGS. 7A and 7B, the output of the first DA converter 13*a* and the output of the second DA converter 13*b* may be determined such that they show different rate of voltage change with respect to a change of 1 bit in the digital counter 12 (the rate of change of the first reference voltage V14*a* in the first voltage range a1 is varied from the rate of change of the second reference voltage V14*b* in the second voltage range a2). By so doing, the digital conversion of the low luminance region may be performed at low resolution and that of the high luminance region may be performed at high resolution. Or alternatively, the digital conversion of the low luminance region may be performed at high resolution and that of the high luminance region may be performed at low resolution.

If the number of effective bits of the output of the digital counter 12 to the first DA converter 13*a* and that to the second DA converter 13*b* are varied from each other, or alternatively, the bit region of the output of the digital counter 12 to the first DA converter 13*a* and that to the second DA converter 13*b* are varied from each other, the first and second voltage ranges a1 and a2 are varied from each other such that the resolution is enhanced only in the required region. For example, if the output of the digital counter 12 to the second DA converter 13*b* is set as a difference obtained by subtracting the least significant bit from the output of the digital counter 12 to the first DA converter 13*a*, the output of the first DA converter 13*a* corresponding to the output of the digital counter 12 varies by the twice number of bits as compared with the output of the second DA converter 13*b* corresponding to the same output of the digital counter 12. As a result, the resolution of the first DA converter 13*a* becomes twice as high as the resolution of the second DA converter 13*b*. This makes it possible to increase the resolution only in a required region. Thus, the digital conversion of the low luminance region is performed at low resolution and that of the high luminance region is performed at high resolution. Or alternatively, the digital conversion of the low luminance region is performed at high resolution and that of the high luminance region is performed at low resolution.

As described above, the number of input bits to the first DA converter 13*a* and that to the second DA converter 13*b* are adjusted or the variation in output value with respect to the change of 1 bit is adjusted such that the reference voltages of the first and second DA converters 13*a* and 13*b* are controlled to vary in the first and second voltage ranges a1 and a2 for the same period of time. As a result, the comparison between the reference voltage and the input analog data is performed in the first and second comparators 14a and 14b simultaneously. Thus, the digital conversion is achieved in a shorter time.

Figure 8A:
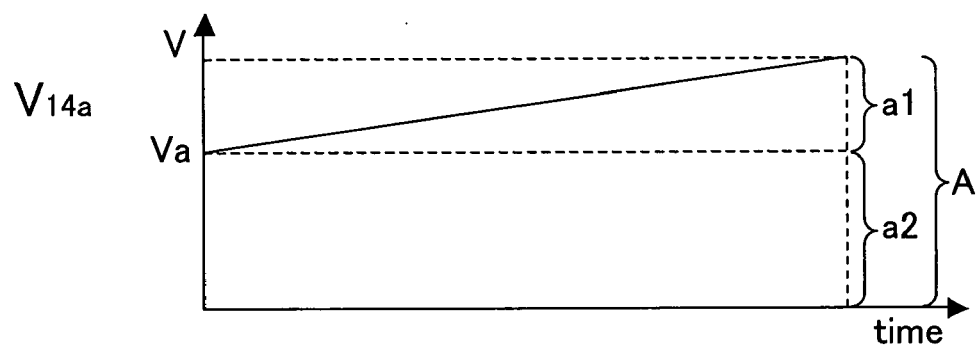
FIGS. 8A and 8B are graphs each illustrating a modification of the reference voltage to be input to the comparator according to the first embodiment of the present invention.
Figure 8B:
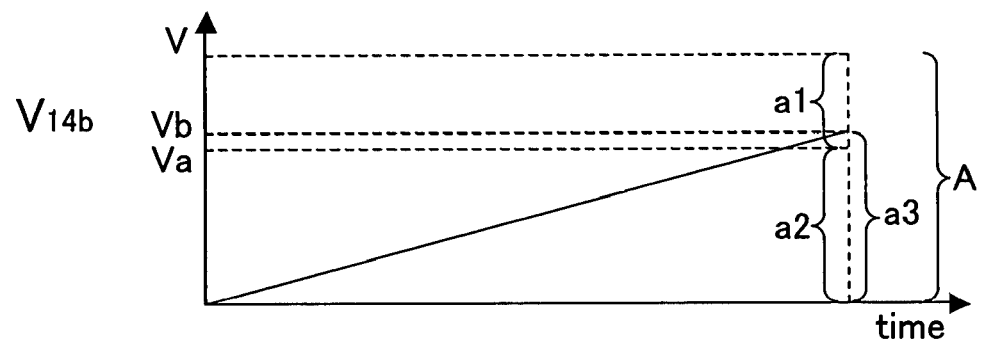

As shown in FIGS. 8A and 8B, the signal voltage may be compared with the first reference voltage V14a which varies linearly within the first voltage range a1 (from Va to the maximum value) and with the second reference voltage V14b which varies linearly within the second voltage range a2 (from the minimum value to Vb). The first and second voltage ranges a1 and a2 may have different sizes and an overlapping range between them and cover the range from the minimum value to the maximum value of the range A of every possible signal voltage of the input analog data.

Thus, when the first and second voltage ranges a1 and a2 have the overlapping region between them and the input analog data exists in the overlapping region, a correction circuit is used to determine the digital output such that discontinuity at the interface between first and second voltage ranges a1 and a2 is alleviated. That is, when the comparison with the first reference voltage V14a which varies within the first voltage range a1 and the comparison with the second reference voltage V14b which varies within the second voltage range a2 are performed separately, the linearity of the digital output at the interface between the first and second reference voltages V14a and V14b is deteriorated and the output image may possibly become unnatural. However, if the correction circuit is provided to make a correction at the interface, the output image becomes less unnatural. Further, the overlap between the voltage range for the first reference voltage V14a and the voltage range for the second reference voltage V14b due to variations in property between the first and second DA converters 13a and 13b is less likely to occur. Moreover, conversion error that occurs when a gap is generated between the voltage ranges is also alleviated.

Figure 9A:
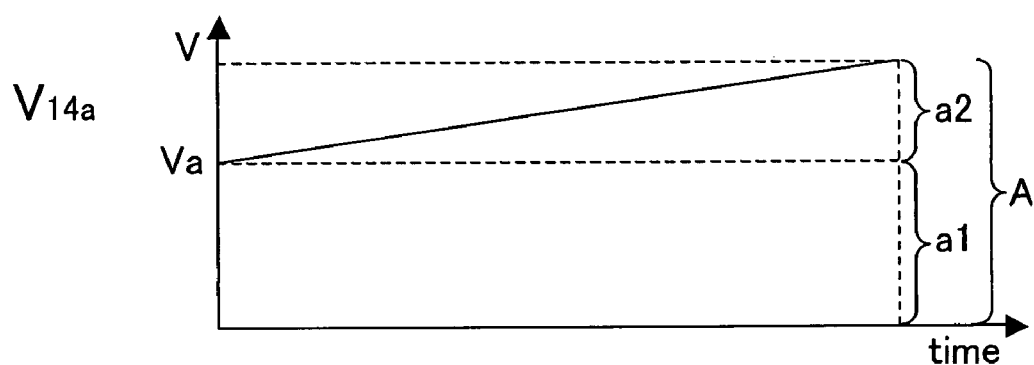
FIGS. 9A and 9B are graphs each illustrating a modification of the reference voltage to be input to the comparator according to the first embodiment of the present invention.
Figure 9B:
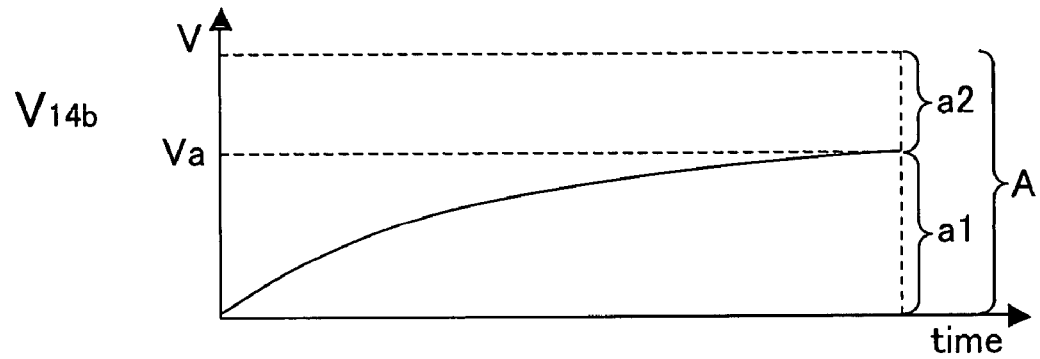

As shown in FIGS. 9A and 9B, at least one of the first and second DA converters 13a and 13b may have an output property other than the linear output property. With this configuration, the discontinuity at the interface between the first and second voltage ranges a1 and a2 is alleviated. In this case, the property other than the linear property may be a property represented by a quadratic function, a logarithmic function or an exponential function or a property represented by a combination of them. Even if the output property is partially curved, the discontinuity at the interface between the first and second voltage ranges a1 and a2 is alleviated. Also in this case, as shown in FIGS. 9A and 9B, the first and second voltage ranges a1 and a2 may be determined to cover the range from the minimum value to the maximum value of the range A of every possible signal voltage of the input analog data. The sizes of the first and second voltage ranges a1 and a2 may be equal or different.

Second Embodiment

Figure 10:
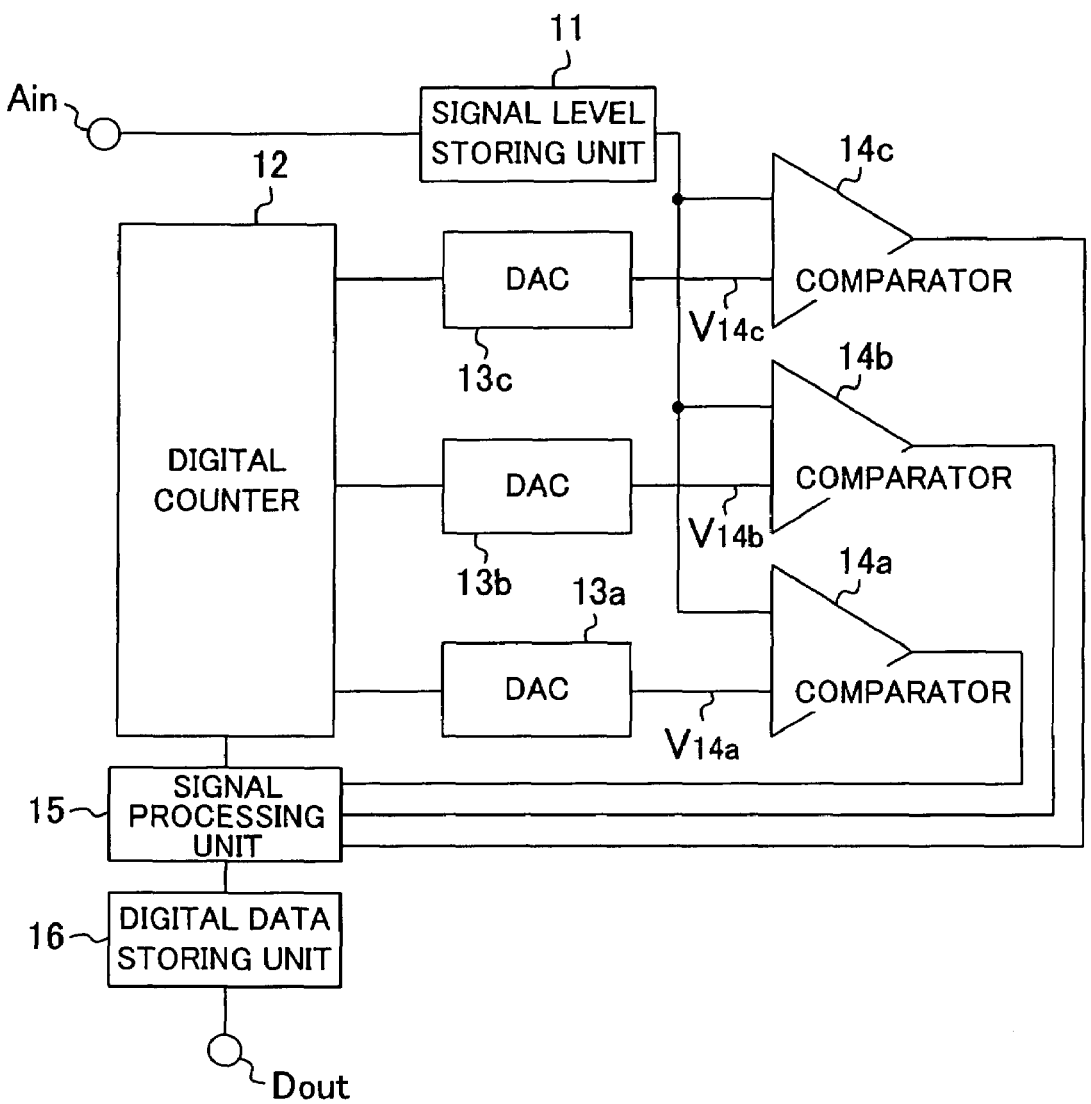
FIG. 10 is a diagram illustrating the structure of an AD converter according to a second embodiment of the present invention.

FIG. 10 shows the structure of an AD converter according to a second embodiment of the present invention.

The AD converter shown in FIG. 10 includes a signal level storing unit 11, a digital counter 12, first to third DA converters (DAC) 13a to 13c, first to third comparators 14a to 14c, a signal processing unit 15 and a digital data storing unit 16.

The AD converter shown in FIG. 10 is configured in the same manner as the AD converter of the first embodiment shown in FIG. 1 except that the three DA converters and the three comparators are provided. Therefore, in the following description, only the features of the present embodiment are explained.

Figure 11A:
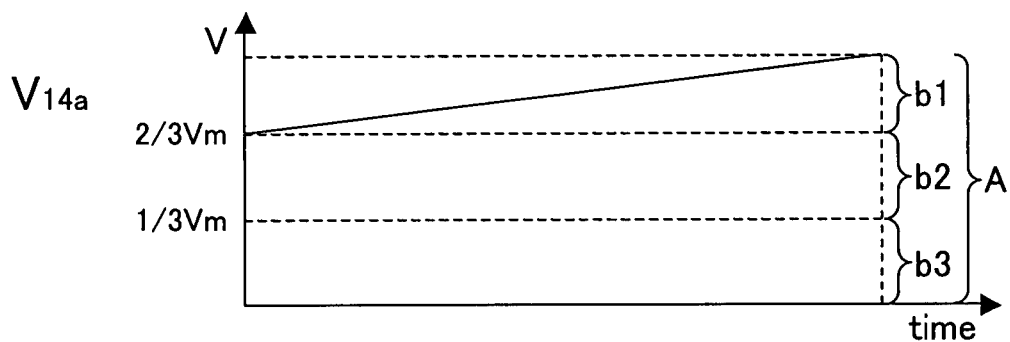
FIGS. 11A to 11C are graphs each illustrating a reference voltage to be input to a comparator according to the second embodiment of the present invention.
Figure 11B:
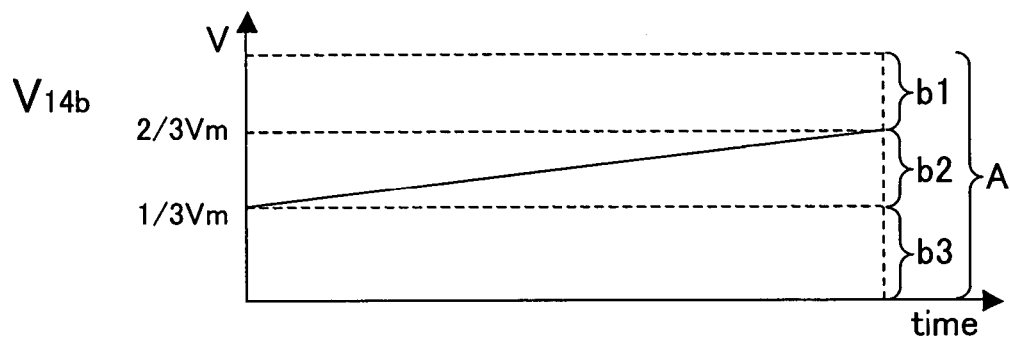
Figure 11C:
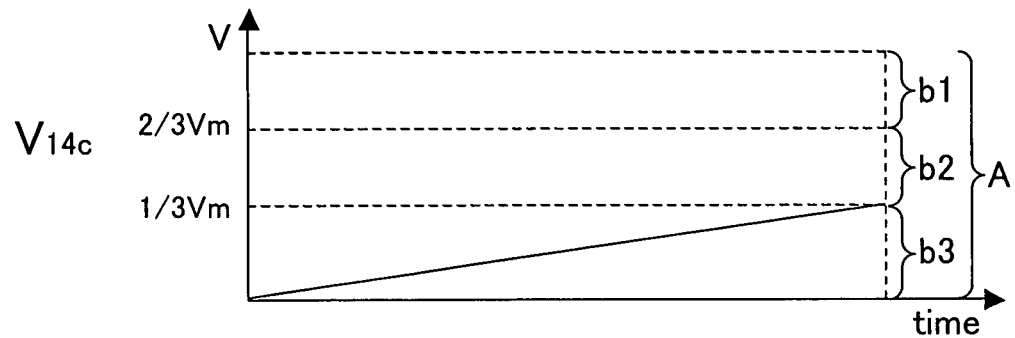

In the first embodiment, two reference voltages which vary in two arbitrary voltage ranges, respectively, in the range A of every possible signal voltage of the input analog data are used. In the present embodiment, in contrast, three DA converters and three comparators are provided as shown in FIGS. 11A to 11C to use three reference voltages which vary within three voltage ranges b1 to b3 covering the range A, respectively. Therefore, the input signal data is compared simultaneously with the different reference voltages which vary in different ranges, thereby enhancing the conversion speed to a further extent. In FIGS. 11A to 11C, the three voltage ranges b1 to b3 are made equal in size. Since the three voltage ranges b1 to b3 are determined to cover the range A, the conversion is performed on every input analog data.

As understood from the first and second embodiments described above, if at least two or more DA converters and the comparators of the same number as the DA converters are provided in the AD converter and the reference voltages of the same number as the DA converters are used and the voltage ranges in which the reference voltages vary, respectively, cover the range A of every possible signal voltage of the input analog data, the conversion speed is enhanced and the conversion of every analog data is allowed.

In this case, the reference voltages may vary in the corresponding voltage ranges in the manner shown in FIGS. 2 to 9. That is, the voltage ranges in which the reference voltages of the at least two or more DA converters vary, respectively, may have any optional width and the reference voltages may vary in any direction. The at least two or more DA converters may have the same or different output property. In this way, the digital conversion of the low luminance region is performed at low resolution and that of the high luminance region is performed at high resolution. Or alternatively, the digital conversion of the low luminance region is performed at high resolution and that of the high luminance region is performed at low resolution.

In this embodiment, at least two or more DA converters and the comparators of the same number as the DA converters are provided in the AD converter and the reference voltages of the same number as the DA converters are used and the voltage ranges in which the reference voltages vary, respectively, cover the range A of every possible signal voltage. However, unlike the present embodiment, the AD converter may be configured to include at least one or more DA converters and the comparators of the same number as the DA converters and use the reference voltages of the same number as the DA converters and the voltage ranges in which the reference voltages vary, respectively, cover the range A of every possible signal voltage. In addition, the one or more DA converters may have an output property other than the linear output property. By so doing, the resolution is enhanced only in the required region. For example, in a DA converter with divided resistances, resistance values of a group of resistances that generate the reference voltage are varied slightly from each other such that the output voltage corresponding to the input digital value shows a desired property. With respect to a group of resistances having the same value, the number of resistance elements between the input digital values is varied such that the output voltage corresponding to the input digital value shows a desired property.

Third Embodiment

Figure 12:
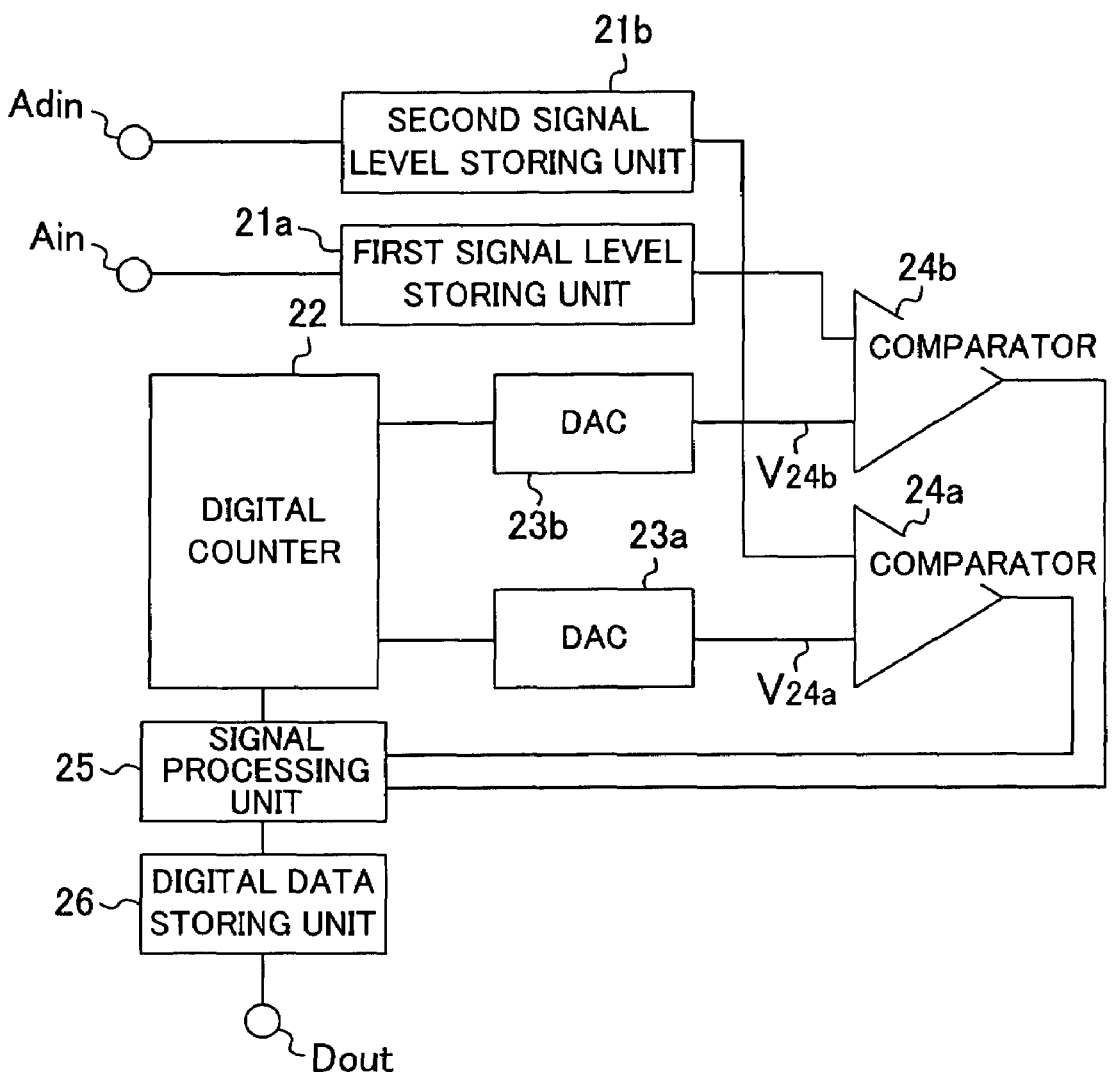
FIG. 12 is a diagram illustrating the structure of an AD converter according to a third embodiment of the present invention.

FIG. 12 shows the structure of an AD converter according to a third embodiment of the present invention.

The AD converter shown in FIG. 12 includes first and second signal level storing units 21a and 21b, a digital counter 22, first and second DA converters (DAC) 23a and 23b, first and second comparators 24a and 24b, a signal processing unit 25 and a digital data storing unit 26.

The AD converter shown in FIG. 12 is configured in the same manner as the AD converter of the first embodiment shown in FIG. 1 except that it includes the second signal level storing unit 21b which stores a signal level of an input analog data from a dark pixel delivered from an analog data input terminal Ain. Therefore, in the following description, only the features of the present embodiment are explained.

When an output value of an image sensor is converted to a digital value, it is preferable to remove variations among pixels and noise components such as thermal noise. For that purpose, in general, an output value from a dark pixel which is in a reset state and an output value from a light-exposed pixel whose level corresponds to the light amount are compared to take the difference between them. The AD converter of the present embodiment is configured in view of such a case.

Figure 13A:
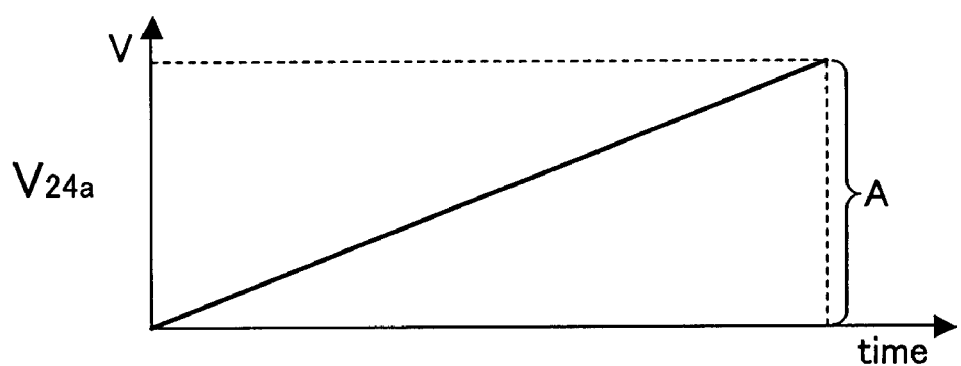
FIGS. 13A and 13B are graphs each illustrating a reference voltage to be input to a comparator according to the third embodiment of the present invention.
Figure 13B:
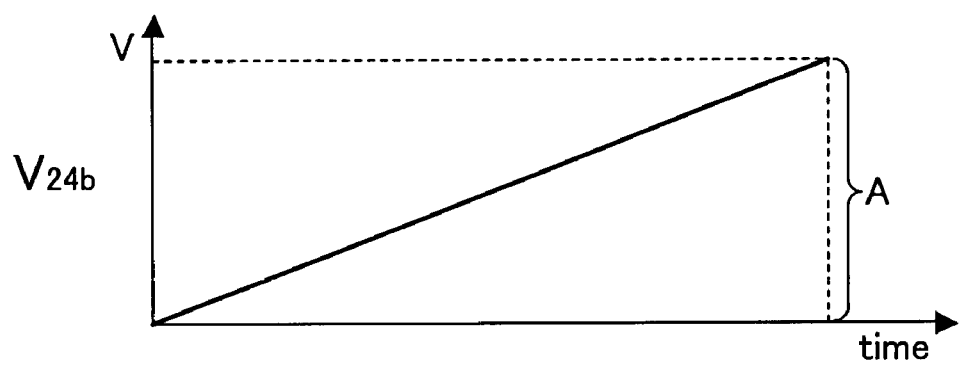

According to the AD converter of the present embodiment, the first comparator 24a compares a signal voltage of an input analog data from the dark pixel stored in the second signal level storing unit 21b with a first reference voltage V24a input from the first DA converter 23a. At the same time, the second comparator 24b compares a signal voltage of an input analog data from the light-exposed pixel stored in the first signal level storing unit 21a with a second reference voltage V24b input from the second DA converter 23b. As shown in FIGS. 13A and 13B, the first reference voltage V24a to be compared with the signal voltage of the input analog data from the dark pixel and the second reference voltage V24b to be compared with the signal voltage of the input analog data from the light-exposed pixel are, for example, reference voltages which vary within the range from the maximum value to the minimum value in the range A of every possible signal voltage of the input analog data. Therefore, in this case, it is not always necessary to use the first and second DA converters 23a and 23b. Instead, a single DA converter which generates the reference voltages shown in FIGS. 13A and 13B may be used to input the reference voltages to the first and second comparators 24a and 24b, respectively.

According to the AD converter of the third embodiment, the input analog data from the dark pixel and the input analog data from the light-exposed pixel are simultaneously compared with the reference voltages V24a and V24b in the first and second comparators 24a and 24b, respectively. Therefore, the input analog data from the dark pixel and the input analog data from the light-exposed pixel are simultaneously converted into digital data. As a result, the input analog data from the dark pixel and the input analog data from the light-exposed pixel are converted to digital in a short time.

Modification of Third Embodiment

Basically, the range of possible values of the input analog data from the dark pixel is narrower than that of the input analog data from the light-exposed pixel. Therefore, as described in the first embodiment, the input analog data from the light-exposed pixel is compared with a reference voltage which varies in the range from the minimum value to the intermediate value in the range A of every possible voltage of the input analog data from the light-exposed pixel and with a reference voltage which varies in the range from the intermediate value to the maximum value in the range A. At the same time, the input analog data from the dark pixel is compared with a reference voltage which varies in the range from the minimum value to the intermediate value in the range of every possible voltage of the input analog data from the dark pixel.

Figure 14:
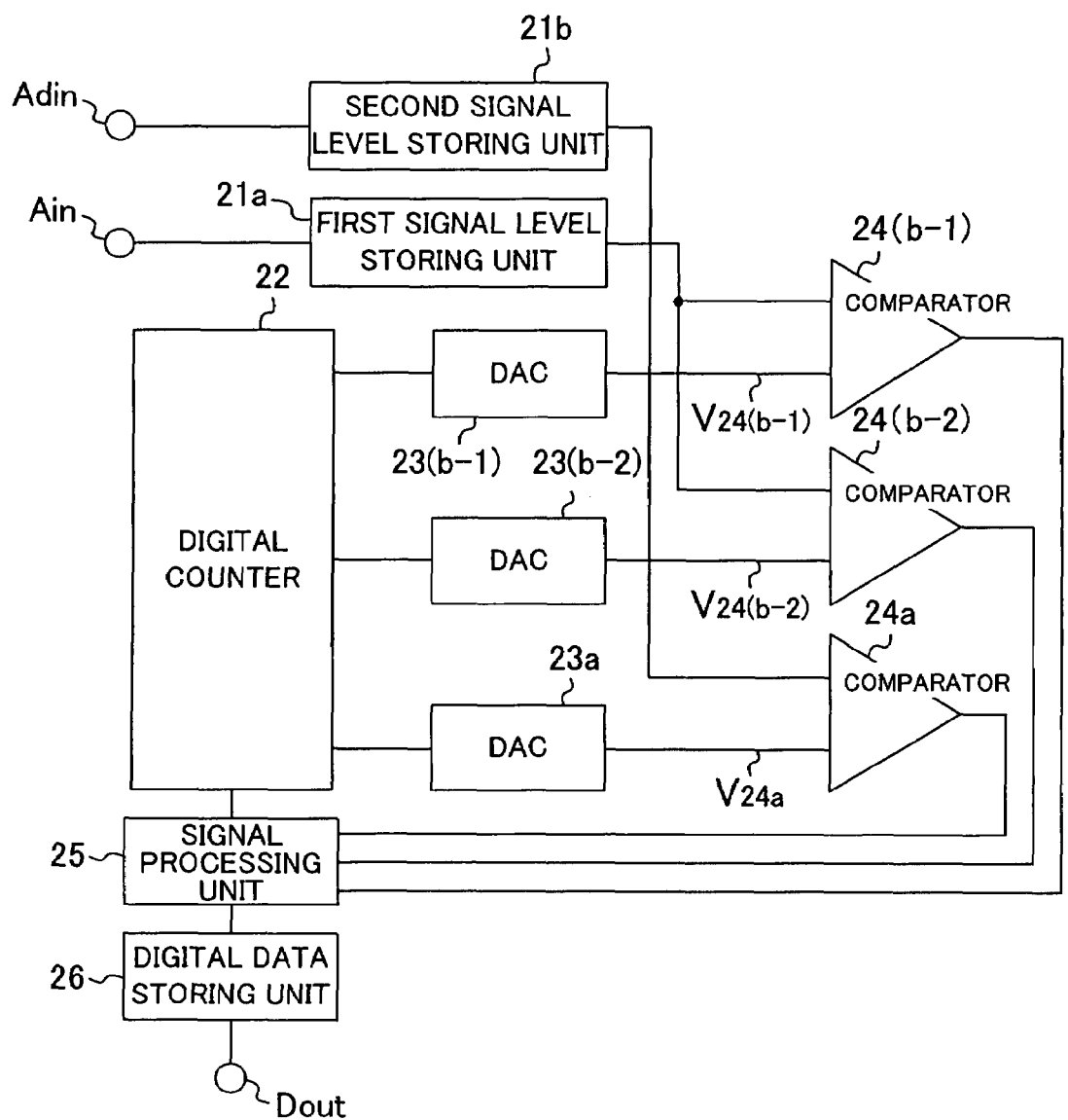
FIG. 14 is a diagram illustrating the structure of an AD converter according to a modification of the third embodiment of the present invention.
Figure 15A:
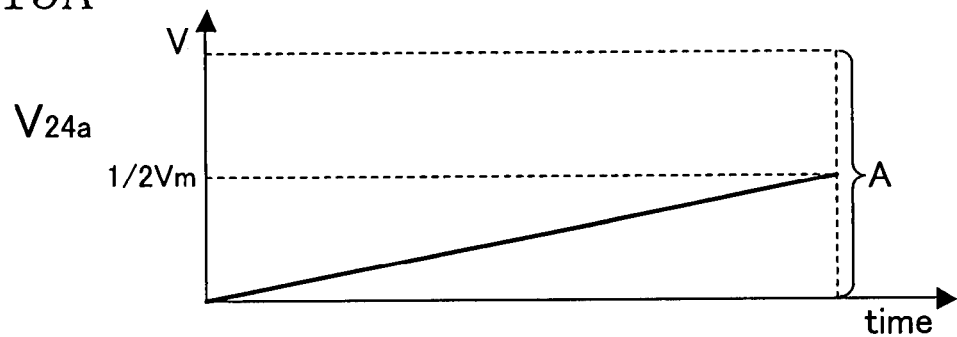
FIGS. 15A to 15c are graphs each illustrating a reference voltage to be input to a comparator according to the modification of the third embodiment of the present invention.
Figure 15B:
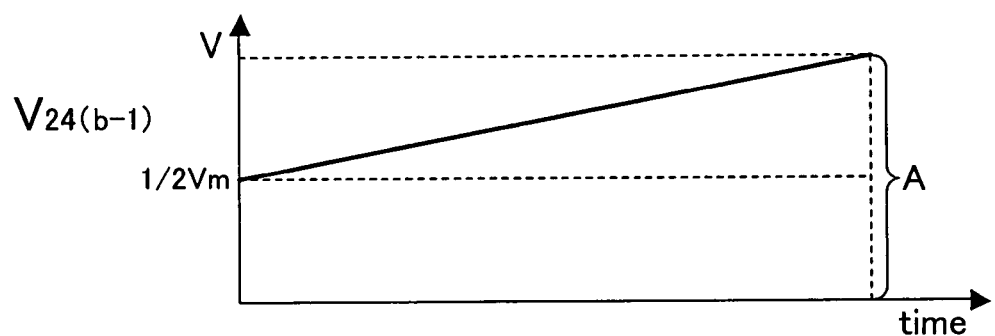
Figure 15C:
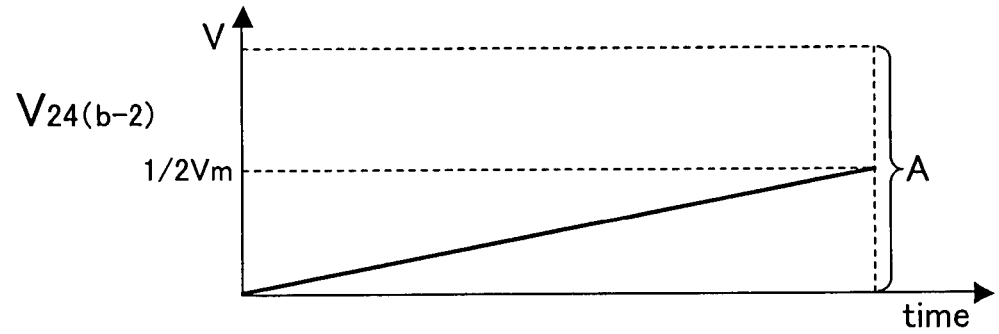

Therefore, in the present modification, as shown in FIG. 14, a first DA converter 23a and a first comparator 24a are configured to compare the input analog data from the dark pixel with a first reference voltage V24a shown in FIG. 15A which varies within the range of every possible voltage of the input analog data from the dark pixel. Further, a second DA converter 23(b-1) and a second comparator 24(b-1) are configured to compare the input analog data from the light-exposed pixel with a second reference voltage V24(b-1) shown in FIG. 15B which varies from the intermediate value to the maximum value in the range of every possible value of the input analog data from the light-exposed pixel. Further, a third DA converter 23(b-2) and a third comparator 24(b-2) are configured to compare the input analog data from the light-exposed pixel with a third reference voltage V24(b-2) shown in FIG. 15C which varies from the minimum value to the intermediate value in the range of every possible value of the input analog data from the light-exposed pixel.

With this configuration, the input analog data from the dark pixel and the input analog data from the light-exposed pixel are simultaneously converted into digital data in a shorter time.

In the present modification, the first DA converter 23a and the third DA converter 23(b-2) may be replaced with a single DA converter which generates the reference voltages shown in FIGS. 14A to 14C.

Fourth Embodiment

Figure 16:
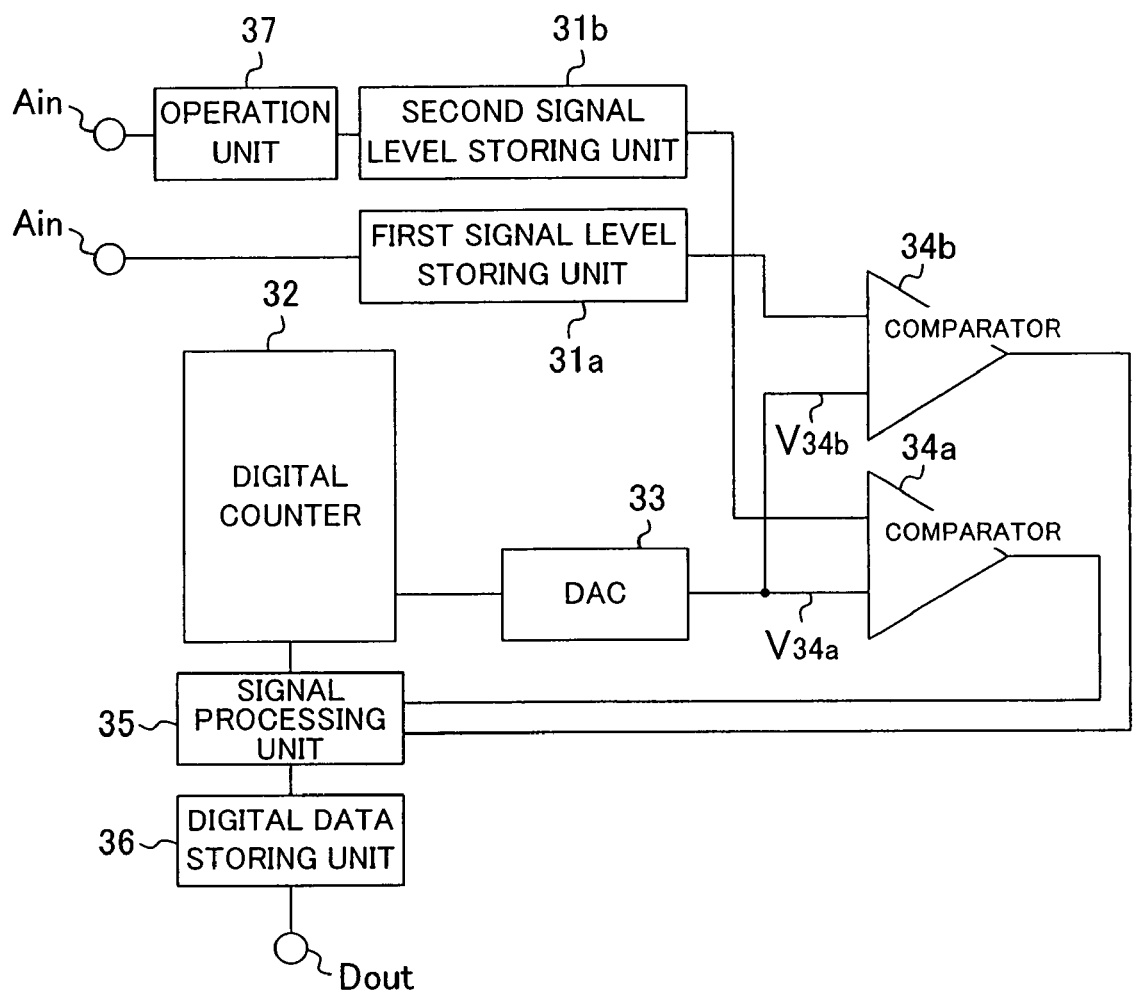
FIG. 16 is a diagram illustrating the structure of an AD converter according to a fourth embodiment of the present invention.

FIG. 16 shows the structure of an AD converter according to a fourth embodiment of the present invention.

The AD converter shown in FIG. 16 includes first and second signal level storing units 31a and 31b, a digital counter 32, a DA converter (DAC) 33, first and second comparators 34a and 34b, a signal processing unit 35, a digital data storing unit 36 and an operation unit 37.

The AD converter shown in FIG. 16 is configured in the same manner as the AD converter of the first embodiment shown in FIG. 1 except that it includes the operation unit 37 for performing an operation on an input analog data delivered from an analog data input terminal Ain and the second signal level storing unit 31b for storing the signal level of the output of the operation unit 37 and that only a single DA converter 33 is provided. Therefore, in the following description, only the features of the present embodiment are explained.

Figure 17A:
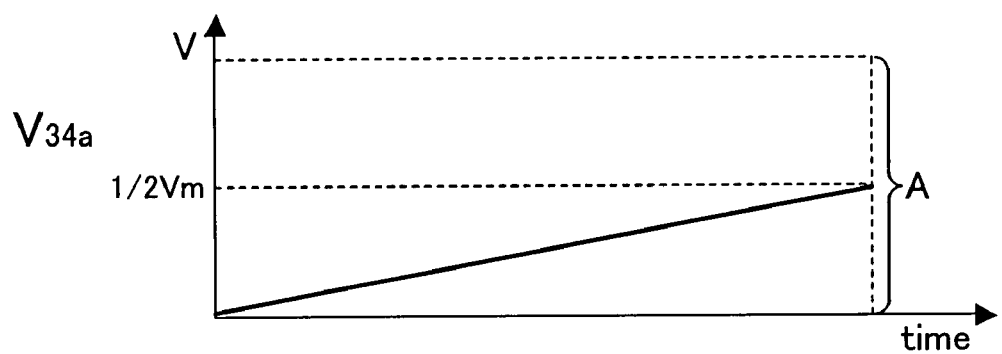
FIGS. 17A and 17B are graphs each illustrating a reference voltage to be input to a comparator according to the fourth embodiment of the present invention.
Figure 17B:
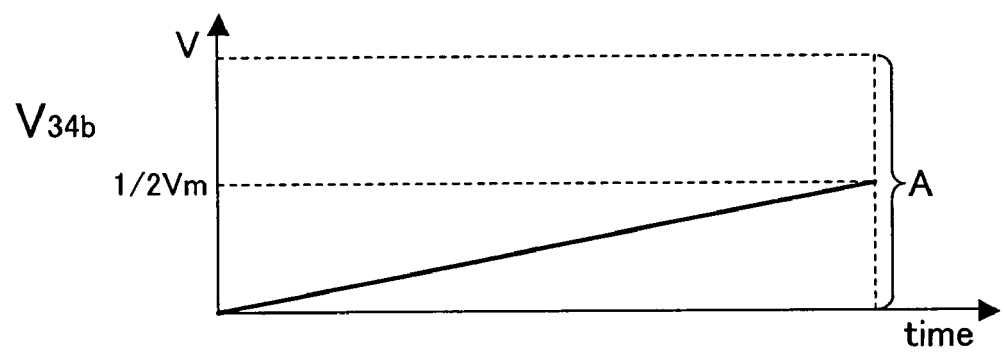
Figure 18:
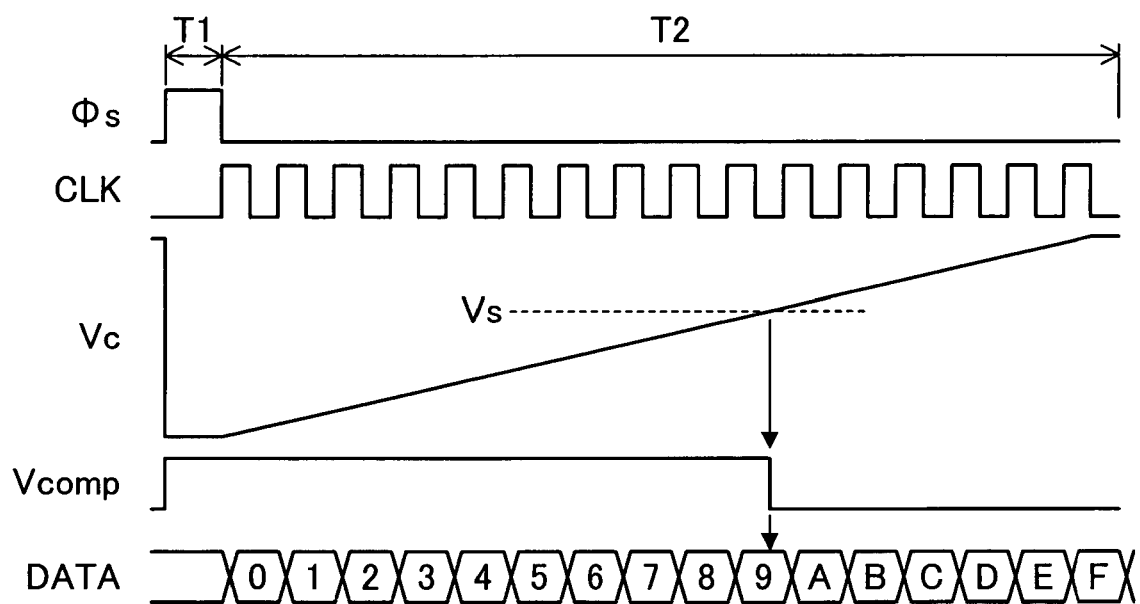
FIG. 18 is a timing chart illustrating how a conventional AD converter works.

The first signal level storing unit 31a stores a signal level of an input analog data delivered from the analog data input terminal Ain, while the second signal level storing unit 31b stores a value obtained by subtracting the intermediate value in the range of every possible value of the input analog data from the value of the input analog data delivered from the analog data input terminal Ain. In the first comparator 34a, the data stored in the second signal level storing unit 31b is compared with a reference voltage V34a shown in FIG. 17A which is input from the DA converter 33 and varies from the minimum value to the intermediate value in the range of every possible value of the input analog data. Simultaneously, in the second comparator 34b, the data stored in the first signal level storing unit 31a is compared with a reference voltage V34b shown in FIG. 17B which is input from the DA converter 33 and the same as the reference voltage V34a. By so doing, the count of the digital counter 32 is reduced to half of the originally required count. Thus, the time for converting the input analog data into digital data is reduced.

The present invention is not limited to the first to fourth embodiments described above. For example, the present invention is also applicable to the following cases.

In the above-described embodiments, an image sensor using a MOS transistor has been used as the image sensor for performing image selection. However, an image sensor using a CCD may also be used.

In the third and fourth embodiments described above, the range of every possible signal voltage is divided in two at the intermediate value thereof to obtain the ranges in which the reference voltages vary, respectively. However, it is not always necessary to divide the range at the intermediate value. Just like in the first embodiment, the ranges for the reference values may be provided in any way as long as they are within the range of every possible signal voltage.

In the third and fourth embodiments described above, the range of every possible signal voltage is divided in two at the intermediate value thereof to obtain the ranges in which the reference voltages vary, respectively. However, just like in the second embodiment, the range of every possible signal voltage may be covered by three or more ranges in which the reference voltages vary, respectively. In such a case, the comparators of the same number as the reference voltages may be used.

According to the present invention, a comparison between the signal voltage and the reference voltage is performed while the reference voltage is gradually changed. Thus, the invention is useful for an AD converter for converting an analog signal into a digital signal.

What is claimed is:

1. An AD converter comprising:
an analog data storing unit for storing an input analog data;
a first DA converter for converting an input digital data into a first analog reference voltage which varies within a first voltage range in a range of every possible signal voltage of the input analog data;
a second DA converter for converting the input digital data into a second analog reference voltage which varies within a second voltage range in the range of every possible signal voltage of the input analog data;
a first comparator for comparing the input analog data from the analog data storing unit with the first reference voltage;
a second comparator for comparing the input analog data from the analog data storing unit with the second reference voltage; and
a digital data storing unit for storing a digital data corresponding to a point of time when a change of state occurs in the comparison results of each of the first and second comparators, wherein:
the first voltage range and the second voltage range have an overlapping range between them, and
the AD converter further comprises a correction circuit for correcting the value of the digital data stored in the digital data storing unit when the input analog data exists in the overlapping range.

2. The AD converter of claim 1, wherein the first voltage range and the second voltage range are summed to constitute the range of every possible signal voltage of the input analog data.

3. The AD converter of claim 2, wherein the first voltage range and the second voltage range are equal in size.

4. The AD converter of claim 3, wherein
the first voltage range is a range covering from the minimum value to the intermediate value in the range of every possible signal voltage of the input analog data and
the second voltage range is a range covering from the intermediate value to the maximum value in the range of every possible signal voltage of the input analog data.

5. The AD converter of claim 4, wherein
the first reference voltage is a voltage which increases with time from the minimum value to the intermediate value in the range of every possible signal voltage of the input analog data and
the second reference voltage is a voltage which decreases with time from the maximum value to the intermediate value in the range of every possible signal voltage of the input analog data.

6. The AD converter of claim 4, wherein
the first reference voltage is a voltage which increases with time from the intermediate value to the maximum value in the range of every possible signal voltage of the input analog data and
the second reference voltage is a voltage which decreases with time from the intermediate value to the minimum value in the range of every possible signal voltage of the input analog data.

7. The AD converter of claim 4, wherein
the first reference voltage is a voltage which increases with time from the intermediate value to the maximum value in the range of every possible signal voltage of the input analog data and
the second reference voltage is a voltage which increases with time from the minimum value to the intermediate value in the range of every possible signal voltage of the input analog data.

8. The AD converter of claim 4, wherein
the first reference voltage is a voltage which decreases with time from the maximum value to the intermediate value in the range of every possible signal voltage of the input analog data and
the second reference voltage is a voltage which decreases with time from the intermediate value to the minimum value in the range of every possible signal voltage of the input analog data.

9. The AD converter of claim 1, wherein the first voltage range and the second voltage range are different in size.

10. The AD converter of claim 1, wherein the rate of change of the first reference voltage with respect to the input digital data is different from the rate of change of the second reference voltage with respect to the input digital data.

11. The AD converter of claim 1, wherein the range of every possible value of the input digital data to be input to the first DA converter is different from the range of every possible value of the input digital data to be input to the second DA converter.

12. The AD converter of claim 1, wherein the time taken for the first reference voltage to vary within the first voltage range is equal to the time taken for the second reference voltage to vary within the second voltage range.

13. The AD converter of claim 1, wherein at least one of the first and second DA converters does not have a linear output property.

14. An AD converter comprising:
a first analog data storing unit for storing an input analog data from a dark pixel;
a second analog data storing unit for storing an input analog data from a light-exposed pixel;
a DA converter for converting an input digital data into an analog reference voltage;
a first comparator for comparing the input analog data from the dark pixel delivered from the first analog data storing unit with the reference voltage;

a second comparator for comparing the input analog data from the light-exposed pixel delivered from the second analog data storing unit with the reference voltage; and a digital data storing unit for storing a digital data corresponding to a point of time when a change of state occurs in the comparison results each of the first and second comparators.

15. An AD converter comprising:

a first analog data storing unit for storing an input analog data from a dark pixel;

a second analog data storing unit for storing an input analog data from a light-exposed pixel;

a first DA converter for converting an input digital data into a first analog reference voltage which varies within a range covering from the minimum value to the intermediate value in a range of every possible signal voltage of the input analog data from the light-exposed pixel;

a second DA converter for converting the input digital data into a second analog reference voltage which varies within a range covering from the intermediate value to the maximum value in the range of every possible signal voltage of the input analog data from the light-exposed pixel;

a first comparator for comparing the input analog data from the dark pixel delivered from the first analog data storing unit with the first reference voltage;

a second comparator for comparing the input analog data from the light-exposed pixel delivered from the second analog data storing unit with the first reference voltage;

a third comparator for comparing the input analog data from the light-exposed pixel delivered from the second analog data storing unit with the second reference voltage; and a digital data storing unit for storing a digital data corresponding to a point of time when a change of state occurs in the comparison results of each of the first, second and third comparators.

16. An AD converter comprising:

a first analog data storing unit for storing an input analog data;

a subtraction circuit for subtracting the intermediate value in a range of every possible signal voltage of the input analog data from the input analog data;

a second analog data storing unit for storing the input analog data from the subtraction circuit after the subtraction;

a DA converter for converting an input digital data into an analog reference voltage which varies in a range covering from the minimum value to the intermediate value in the range of every possible signal voltage of the input analog data;

a first comparator for comparing the input analog data from the first analog data storing unit with the reference voltage;

a second comparator for comparing the input analog data after the subtraction from the second analog data storing unit with the reference voltage; and a digital data storing unit for storing a digital data corresponding to a point of time when a change of state occurs in the comparison results of each of the first and second comparators.

* * * * *